US008462529B2

(12) United States Patent
Ward et al.

(10) Patent No.: US 8,462,529 B2
(45) Date of Patent: Jun. 11, 2013

(54) POWER CONVERTER ASSEMBLY WITH SYMMETRICAL LAYOUT OF POWER MODULES

(75) Inventors: Terence G. Ward, Redondo Beach, CA (US); Gregory S. Smith, Woodland Hills, CA (US); George John, Cerritos, CA (US); David F. Nelson, Agoura Hills, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 814 days.

(21) Appl. No.: 12/178,865

(22) Filed: Jul. 24, 2008

(65) Prior Publication Data

US 2009/0032320 A1 Feb. 5, 2009

Related U.S. Application Data

(60) Provisional application No. 60/952,765, filed on Jul. 30, 2007.

(51) Int. Cl.
*H02M 7/537* (2006.01)

(52) U.S. Cl.
USPC .......................................................... 363/131

(58) Field of Classification Search
USPC ............... 363/37, 55, 58, 131, 132, 144–147, 363/15, 40, 321; 307/10.1; 323/282; 322/25
See application file for complete search history.

(56) References Cited

U.S. PATENT DOCUMENTS

| | | | |
|---|---|---|---|
| 5,512,782 A * | 4/1996 | Kobayashi | 257/691 |
| 5,512,790 A | 4/1996 | Lachenmaier et al. | |
| 5,552,976 A | 9/1996 | Munro et al. | |
| 6,154,383 A | 11/2000 | Cardwell, Jr. | |
| 6,178,514 B1 | 1/2001 | Wood | |
| 6,310,468 B1 | 10/2001 | Feldtkeller | |
| 6,525,950 B1 | 2/2003 | Shirakawa et al. | |
| 7,224,145 B2 * | 5/2007 | Pierret et al. | 322/25 |
| 7,323,860 B2 | 1/2008 | Kaneda | |
| 7,560,887 B2 | 7/2009 | Pierret et al. | |
| 7,683,511 B2 | 3/2010 | Iwashima et al. | |

(Continued)

FOREIGN PATENT DOCUMENTS

| | | | |
|---|---|---|---|
| JP | 07-274537 | * | 10/1955 |
| JP | 2004048823 A | | 2/2004 |
| JP | 2004297847 A | | 10/2004 |

OTHER PUBLICATIONS

U.S. Office Action for U.S. Appl. No. 12/178,897 mailed Feb. 14, 2011.

(Continued)

*Primary Examiner* — Adolf Berhane
*Assistant Examiner* — Yemane Mehari
(74) *Attorney, Agent, or Firm* — Ingrassia Fisher & Lorenz, P.C.

(57) ABSTRACT

A power converter assembly is provided. The power converter assembly includes first, second, and third power modules. The second power module is coupled to the first power module such that the second power module is separated from the first power module by a first distance. The third power module is coupled to the first and second power modules such that the third power module is separated from the second power module by a second distance and is separated from the first power module by a third distance. The first, second, and third distances are substantially the same.

16 Claims, 7 Drawing Sheets

U.S. PATENT DOCUMENTS

| | | |
|---|---|---|
| 7,742,303 B2 | 6/2010 | Azuma et al. |
| 7,872,383 B2 | 1/2011 | Dubuc et al. |
| 7,932,649 B2 | 4/2011 | Dubuc et al. |
| 2004/0189114 A1 | 9/2004 | Iwashima et al. |
| 2011/0012425 A1* | 1/2011 | Ward et al. .................. 307/10.1 |

OTHER PUBLICATIONS

Office Action mailed Jun. 23, 2011 for U.S. Appl. No. 12/891,316, filed Oct. 12, 2011.

Chinese Office Action, dated Feb. 22, 2012, for Chinese Patent Application No. 200810215441.8.

Notice of Allowance, dated Dec. 1, 2011, for U.S. Appl. No. 12/891,316.

Office Action, dated Apr. 12, 2012, issued in U.S. Appl. No. 12/891,316.

Notice of Allowance, dated Sep. 10, 2012, issued in U.S. Appl. No. 12/891,316.

Chinese Office Action, dated Sep. 21, 2011, for Chinese Patent Application No. 200810215441.8.

German Office Action, dated Feb. 11, 2013, for German Patent Application No. 10 2008 035 233.0.

* cited by examiner

US 8,462,529 B2

POWER CONVERTER ASSEMBLY WITH SYMMETRICAL LAYOUT OF POWER MODULES

CROSS-REFERENCE TO RELATED APPLICATION

This application claims the benefit of U.S. provisional patent application Ser. No. 60/952,765, filed Jul. 30, 2007 (the entire content of which is incorporated by reference herein).

TECHNICAL FIELD

The present invention generally relates to power converters, and more particularly relates to an automotive power converter with a symmetrical layout of power modules within the power converter.

BACKGROUND OF THE INVENTION

In recent years, advances in technology, as well as ever-evolving tastes in style, have led to substantial changes in the design of automobiles. One of the changes involves the complexity of the electrical systems within automobiles, particularly alternative fuel vehicles, such as hybrid, electric, and fuel cell vehicles. Such alternative fuel vehicles typically use one or more electric motors, perhaps in combination with another actuator, to drive the wheels. Additionally, such automobiles may also include other motors, as well as other high voltage components, to operate the other various systems within the automobile, such as the air conditioner.

Due to the fact that alternative fuel automobiles typically include only direct current (DC) power supplies, direct current-to-alternating current (DC/AC) inverters (or power inverters) are provided to convert the DC power to alternating current (AC) power, which is generally required by the motors. Such vehicles, particularly fuel cell vehicles, also often use two separate voltage sources, such as a battery and a fuel cell, to power the electric motors that drive the wheels. Thus, power converters, such as direct current-to-direct current (DC/DC) converters, are typically also provided to manage and transfer the power from the two voltage sources.

High-power-density inverters often employ liquid cooling where the switches, attached to a substrate and/or base plate, are mounted on a liquid cooled heat sink. A conventional three phase inverter is made from three half bridges or legs. The traction power in automotive applications is such that it is difficult to have the three half bridges assembled on a single substrate. Additionally, having all the switches on a single substrate presents challenges in attaching a large substrate to a base plate or heat sink, adversely affecting the thermal performance and reliability of the inverter. As a result, the half bridges are assembled on separate substrates, which are then packaged with or without a base plate to form a three phase (e.g., phases A, B, and C) inverter.

Typically, the capacitive coupling between phase A and phase B is not the same as the coupling between phase B and phase C or the coupling between C and A, and vice versa. The busbar length from the switches to the DC link capacitor and AC output are also not the same for all the phases, resulting in unequal stray inductances and resistances for the three phases. Unequal parasitic effects in three phases result in unequal distribution of losses on the three substrates, adversely affecting the long term reliability of the inverter. Additionally, if the power requirements are changed, more switches may need to be added to the substrates. Further, if a dual inverter is desired, considerable changes in packaging may be required, resulting in increased inverter foot print, volume, and cost.

Therefore, it is desirable to provide an inverter layout with improved performance as related to the characteristics described above, as well as a layout that allows for advanced thermal management. Furthermore, other desirable features and characteristics of the present invention will become apparent from the subsequent description taken in conjunction with the accompanying drawings and the foregoing technical field and background.

SUMMARY OF THE INVENTION

A power converter assembly is provided. The power converter assembly includes first, second, and third power modules. The second power module is coupled to the first power module such that the second power module is separated from the first power module by a first distance. The third power module is coupled to the first and second power modules such that the third power module is separated from the second power module by a second distance and is separated from the first power module by a third distance. The first, second, and third distances are substantially the same.

An automotive inverter assembly is provided. The automotive inverter assembly includes a base and a plurality of substantially identical inverter modules coupled to the base. The plurality of substantially identical inverter modules includes a plurality of pairs of adjacent inverter modules. Each of the pairs includes first and second inverter modules. A selected point on the first inverter module is separated from a corresponding point on the second inverter module by a distance within each pair. The plurality of substantially identical inverter modules is arranged such that the distance is substantially the same for each pair of adjacent inverter modules.

An automotive drive system is provided. The automotive drive system includes an electric motor, a direct current (DC) power supply, a power inverter, and a processor. The DC power supply is coupled to the electric motor. A power inverter is coupled to the electric motor and the DC power supply to receive DC power from the DC power supply and provide alternating current (AC) power to the electric motor. The power inverter includes a base, a first power module coupled to the base, a second power module coupled to the base such that the second power module is separated from the first power module by a first distance, and a third power module coupled to the base such that the third power module is separated from the second power module by a second distance and is separated from the first power module by a third distance. The first, second, and third distances are substantially the same. The processor is in operable communication with and configured to control the electric motor, the DC power supply, and the power inverter.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, and brief summary, or the following detailed description.

The following description refers to elements or features being "connected" or "coupled" together. As used herein, "connected" may refer to one element/feature being mechanically joined to (or directly communicating with) another element/feature, and not necessarily directly. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment.

Further, various components and features described herein may be referred to using particular numerical descriptors, such as first, second, third, etc., as well as positional and/or angular descriptors, such as horizontal and vertical. However, such descriptors may be used solely for descriptive purposes relating to drawings and should not be construed as limiting, as the various components may be rearranged in other embodiments. It should also be understood that FIGS. 1-8 are merely illustrative and may not be drawn to scale. Further FIG. 1 to FIG. 8 illustrate power converter assemblies. In one embodiment, a power converter assembly includes first, second, and third power modules. The second power module is coupled to the first power module such that the second power module is separated from the first power module by a first distance. The third power module is coupled to the first and second power modules such that the third power module is separated from the second power module by a second distance and is separated from the first power module by a third distance. The first, second, and third distances are substantially the same.

Figure 1:
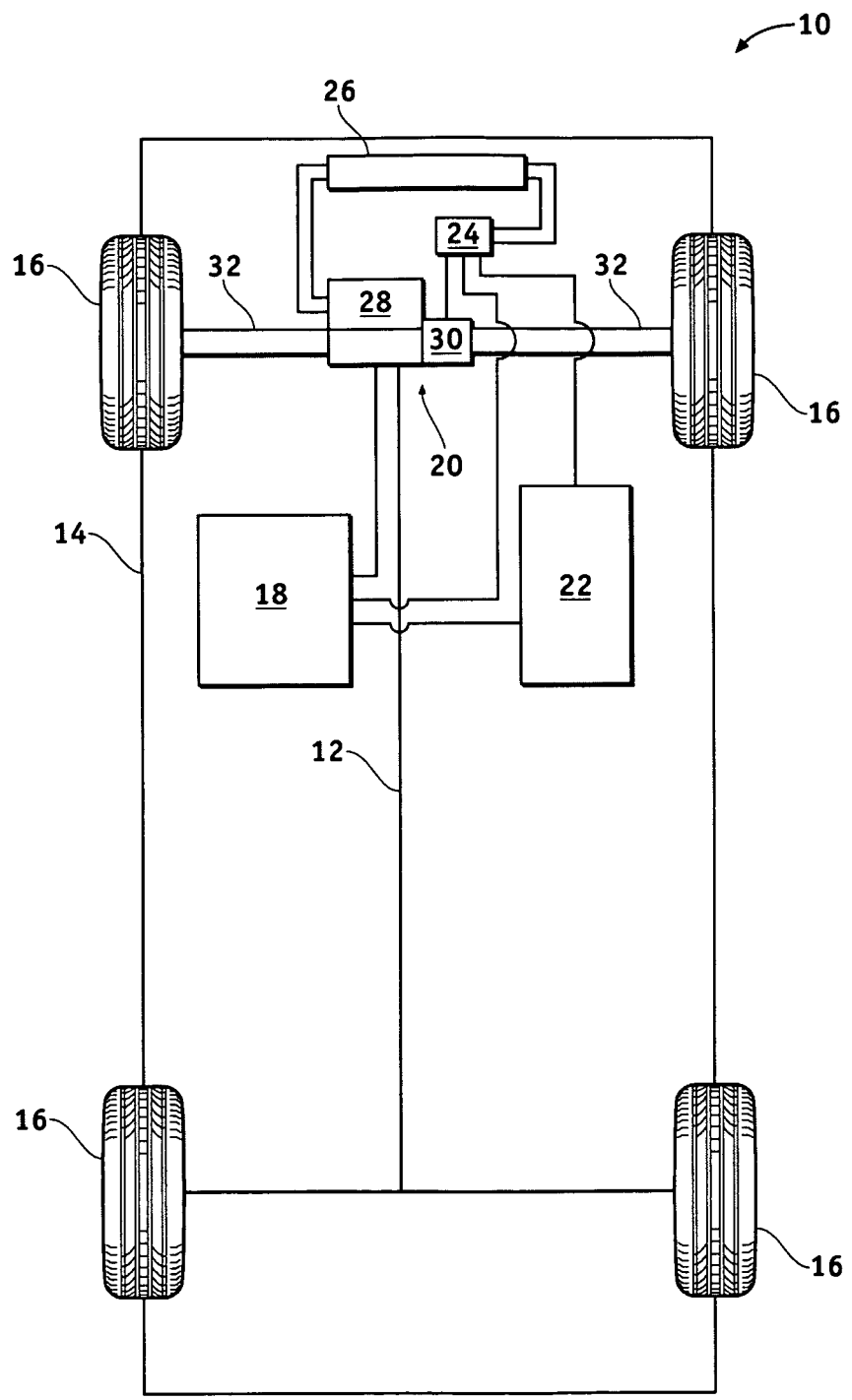
FIG. 1 is a schematic view of an exemplary automobile according to one embodiment of the present invention.

FIG. 1 illustrates a vehicle (or "automobile") 10, according to one embodiment of the present invention. The automobile 10 includes a chassis 12, a body 14, four wheels 16, and an electronic control system 18. The body 14 is arranged on the chassis 12 and substantially encloses the other components of the automobile 10. The body 14 and the chassis 12 may jointly form a frame. The wheels 16 are each rotationally coupled to the chassis 12 near a respective corner of the body 14.

The automobile 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The automobile 10 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine, and an electric motor.

In the exemplary embodiment illustrated in FIG. 1, the automobile 10 is a hybrid vehicle, and further includes an actuator assembly 20, a battery (or direct current (DC) power supply) 22, a power inverter assembly (or inverter) 24, and a radiator 26. The actuator assembly 20 includes a combustion engine 28 and an electric motor/generator (or motor) 30. As will be appreciated by one skilled in the art, the electric motor 30 includes a transmission therein, and although not illustrated also includes a stator assembly (including conductive coils), a rotor assembly (including a ferromagnetic core), and a cooling fluid (i.e., coolant). The stator assembly and/or the rotor assembly within the electric motor 30 may include multiple electromagnetic poles (e.g., sixteen poles), as is commonly understood.

Still referring to FIG. 1, in one embodiment, the combustion engine 28 and the electric motor 30 are integrated such that both are mechanically coupled to at least some of the wheels 16 through one or more drive shafts 32. The radiator 26 is connected to the frame at an outer portion thereof and although not illustrated in detail, includes multiple cooling channels therein that contain a cooling fluid (i.e., coolant) such as water and/or ethylene glycol (i.e., "antifreeze") and is coupled to the engine 28 and the inverter 24.

Figure 2:
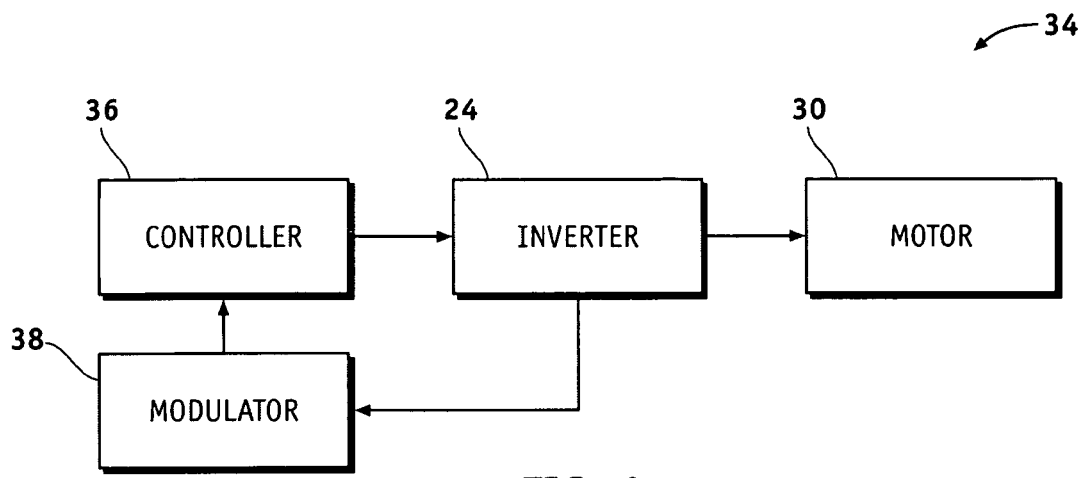
FIG. 2 is a block diagram of a voltage source inverter system within the automobile of FIG. 1.

Referring to FIG. 2, a voltage source inverter system (or electric drive system) 34 is shown in accordance with an exemplary embodiment of the present invention. The voltage source inverter system 34 includes a controller 36 coupled to an output of a modulator 38, which in turn has an input coupled to a first output of the inverter 24. The controller 36 has an output coupled to an input of the inverter 24, which has a second output coupled to the motor 30. The controller 36 and the modulator 38 may be integral with the electronic control system 18 shown in FIG. 1.

Figure 3:
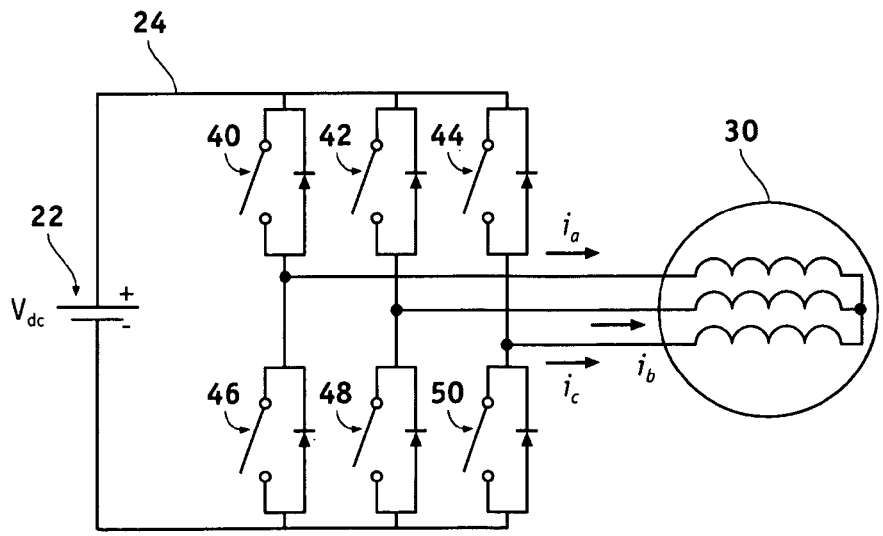
FIG. 3 is a schematic view of an inverter within the automobile of FIG. 1.

FIG. 3 schematically illustrates the inverter 24 (or power converter) of FIGS. 1 and 2 in greater detail. The inverter 24 includes a three-phase circuit coupled to the motor 30. More specifically, the inverter 24 includes a switch network having a first input coupled to a voltage source $V_{dc}$ (e.g., the battery 22) and an output coupled to the motor 30. Although a single voltage source is shown, a distributed DC link with two series sources may be used.

The switch network comprises three pairs (a, b, and c) of series switches with antiparallel diodes (i.e., antiparallel to each switch) corresponding to each of the phases of the motor 30. Each of the pairs of series switches comprises a first switch, or transistor, (i.e., a "high" switch) 40, 42, and 44 having a first terminal coupled to a positive electrode of the voltage source 22 and a second switch (i.e., a "low" switch) 46, 48, and 50 having a second terminal coupled to a negative electrode of the voltage source 22 and a first terminal coupled to a second terminal of the respective first switch 40, 42, and 44.

Figure 4:
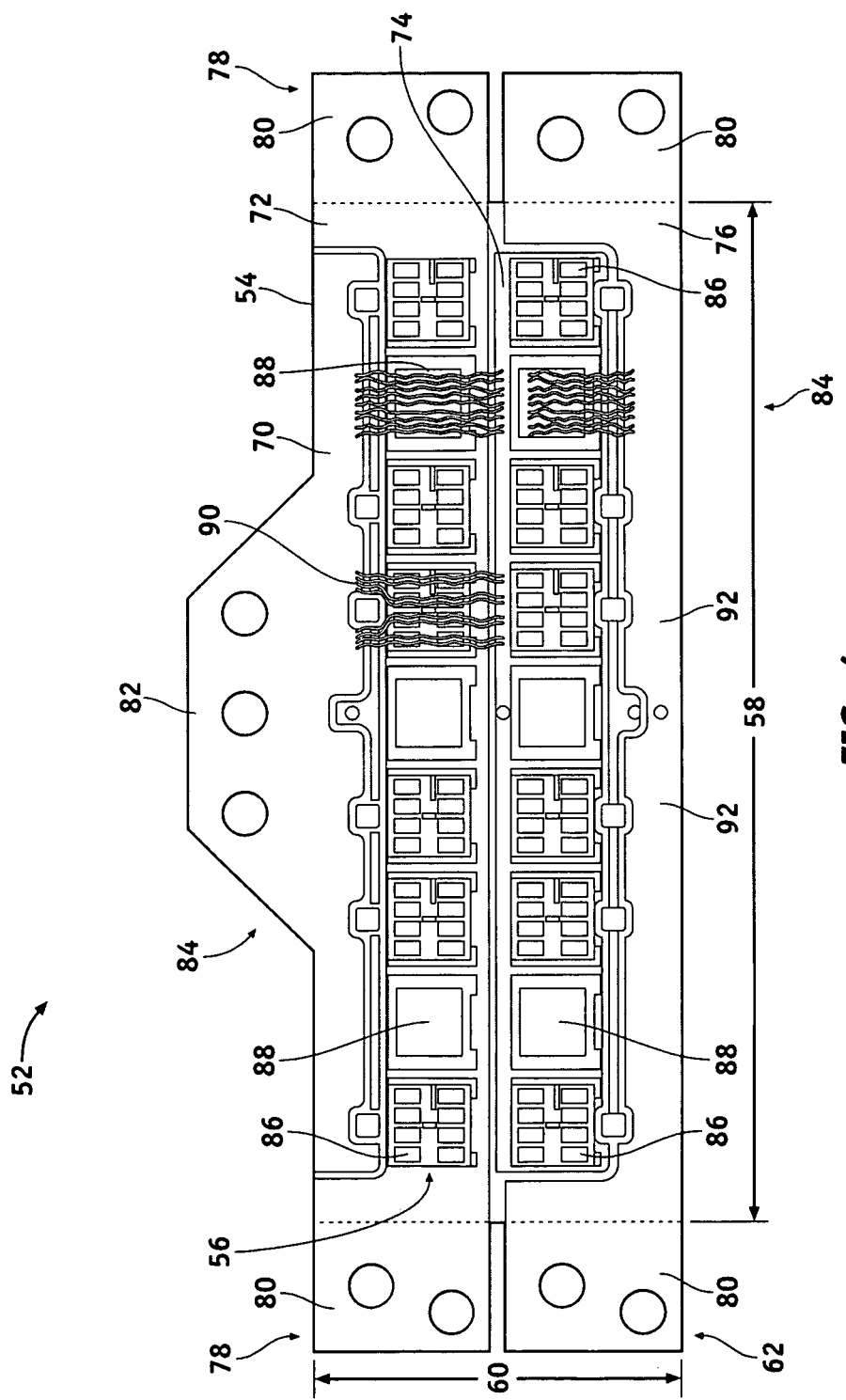
FIG. 4 is a plan view of an upper surface of an inverter module within the inverter of FIG. 3 according to one embodiment of the present invention.
Figure 5:
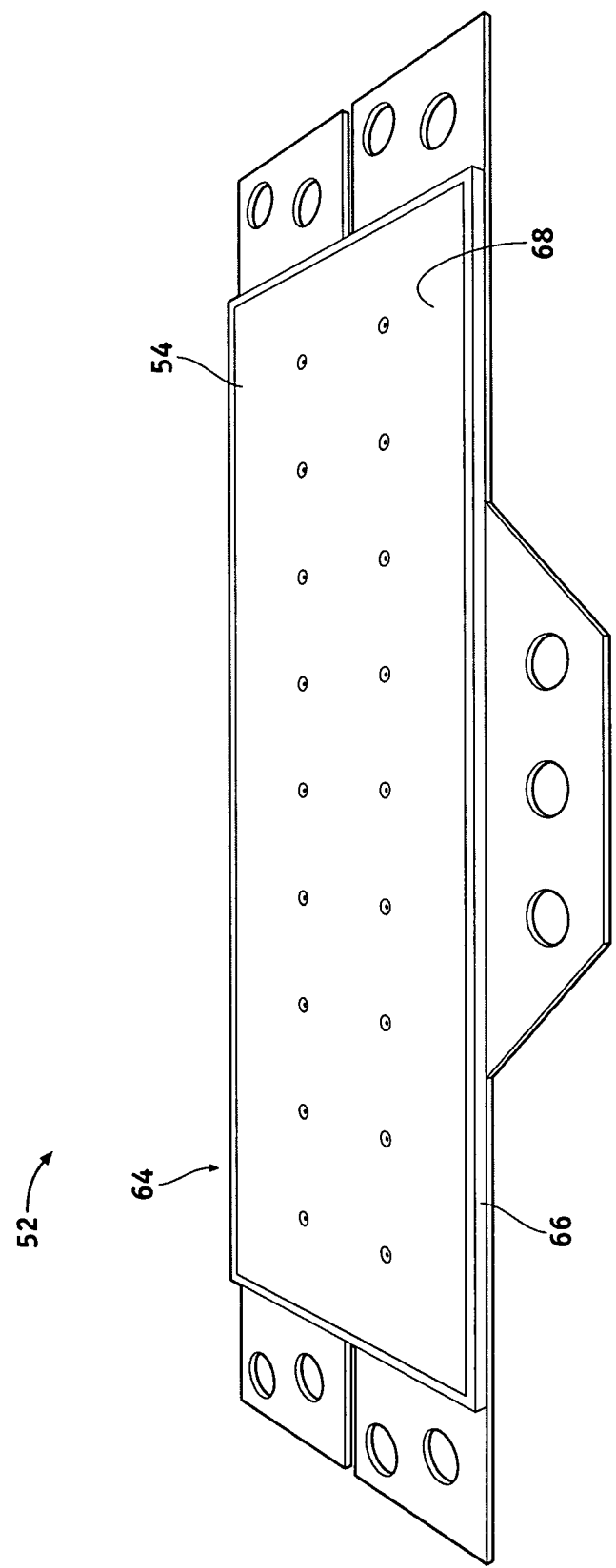
FIG. 5 is a perspective view of a lower surface of the inverter module of FIG. 4.

FIGS. 4 and 5 illustrate an inverter (or power) module 52 of the inverter assembly 24 according to one embodiment of the invention. The inverter module 52 includes a substrate 54 and multiple electronic devices 56 on the substrate 54. The substrate 54 is substantially rectangular with, for example, a length 58 between 100 and 120 millimeters (mm), a width 60 between 20 and 30 mm, and a thickness (not shown) of between 1 and 5 mm. The substrate 54 has an upper surface 62 and a lower surface 64 and, in one embodiment, is a direct bonded copper (DBC) substrate, as is commonly understood, with a ceramic core 66 (e.g., alumina or aluminum nitride) and copper layers 68 formed on, or bonded to, opposing sides (i.e., the upper and lower surfaces 62 and 64) of the core 66.

Referring to FIG. 4, the copper layer 68 on the upper surface 62 is etched to form various conductive members (e.g., bus bars) 70, 72, 74, and 76 substantially extending between opposing ends 78 of the substrate 54. As shown, DC terminals 80 are connected to bus bars 72 and 76 at the opposing ends 78 of the inverter module 52, and an alternating current (AC) terminal 82 is connected to bus bar 70 along one of two opposing sides 84 of the inverter module 52.

The electronic devices 56 include two rows of transistor die (or dies) 86 and diode die 88 mounted to bus bars 72 and 74, respectively. The transistor die 86 each include a semiconductor substrate (e.g., silicon substrate) with an integrated circuit formed thereon that includes one or more of the switches in the form of individual semiconductor devices, such as insulated gate bipolar transistors (IGBTs), as is commonly understood.

Still referring to FIG. 4, the inverter module also includes a plurality of wire bonds 90 that interconnect the electronic devices 56 and the bus bars 70, 72, 74, and 76. For illustrative clarity, only some of the wire bonds 90 are shown in FIG. 4. It should be noted that the electrical connections between the die 86 and 88 on bus bar 72 and the DC terminals 80 connected to bus bar 72 are made where the die 86 and 88 are connected to bus bar 72 (i.e., device portions of bus bar 72). However, the electrical connections between the die 86 and 88 on bus bar 74 and the DC terminals connected to bus bar 76 are made via the wire bonds 90 that connect the die 86 and 88 on bus bar 74 to device portions 92 of bus bar 76. Thus, the device portions (i.e., the portions of bus bars 72 and 76) into which DC current flows) are located between the DC terminals 80 of the respective bus bars 72 and 76.

In other words, if the bus bars 72 and 76 are considered to be conductive wires or traces, the DC terminals 80 are connected to the opposing ends of the traces, and the device portions of the bus bars are connected to the traces between the opposing ends. As suggested in FIG. 3, the DC terminals 80 are electrically connected to the battery 22 (FIG. 1), while the AC terminal 82 is electrically connected to the motor 30. It should be noted that each of the electronic devices 56 (e.g., first, second, third, fourth, etc.) may be considered to have a respective device portion 92 on bus bar 72 or 76.

FIG. 5 illustrates the lower surface 64 of the inverter module 52. As shown, the copper layer 68 on the lower surface 64 is etched only around a periphery thereof such to form a heat sink or cooling plate that is electrically disconnected from bus bars 70, 72, 74 and 76 and die 86 and 88. Although not specifically shown, the lower surface 64 of the inverter module 52 may be placed into contact with a cooling device, such as a heat sink, or a cold plate through which a wicking fluid is flown, to remove heat produced during operation, as is commonly understood in the art.

Figure 6:
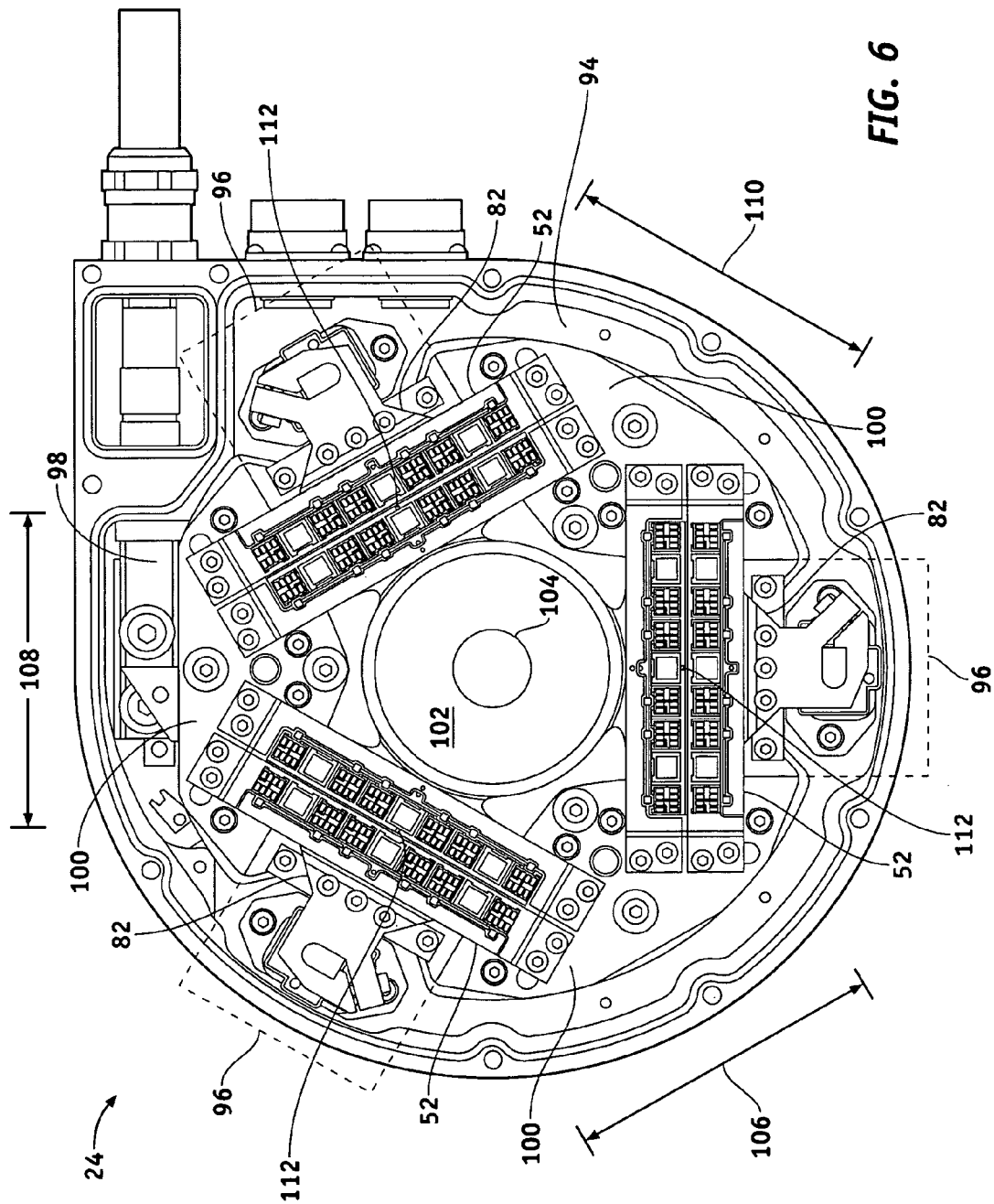
FIG. 6 is a plan view of an inverter assembly according to one embodiment of the present invention.

FIG. 6 illustrates the inverter assembly 24, according to one embodiment of the present invention, in greater detail. The inverter assembly 24 includes a housing (or capacitor housing) 94 and multiple inverter modules 52, similar to that described above, and terminal assemblies 96. The housing 94 is substantially circular in shape and includes a DC input terminal 98, multiple DC conductors 100, and a motor shaft opening 102. Although not shown in detail, the DC conductors 100 electrically connect the DC input terminal 98 to the DC terminals 80 of the inverter modules 52. The motor shaft opening 102 is circular in shape and is located at a central portion of the housing 94. The housing 94 may be made of a composite or plastic material and includes one or more capacitors therein (not shown). In one embodiment, a shaft 104 of the motor 30 (which is adjacent to the housing 94 in one embodiment) is inserted through the motor shaft opening 102 of the housing 94 (FIG. 6) to mate with the transmission of the automobile 10 (FIG. 1).

In the depicted embodiment, the inverter assembly 24 includes three inverter modules 52 mounted to the housing 94, each being associated with one of the phases of operation of the motor, as is commonly understood. As shown, the inverter modules are symmetrically arranged around the motor shaft 104 and the motor shaft opening 102 (and/or the housing 94) with the AC terminals 82 thereof facing away from the motor shaft opening 102. In the embodiment shown in FIG. 6, with three inverter modules 52, the inverter modules 52 are equidistant with respect to each other. That is, the distance between all three inverter modules 52 is the same. Stated differently, a distance between corresponding points (or portions) on all three inverter modules 52 are separated by the same distance. The corresponding points may be randomly selected on the inverter modules 52, as all three are substantially identical, at least in the depicted embodiment. For example, distances 106, 108, and 110 are measured between central portions 112 of the inverter modules 52 (and/or the substrates 54). As is apparent in FIG. 6, all three distances 106, 108, and 110 are substantially the same. The symmetry shown in FIG. 6 also includes a rotational symmetry (e.g., three-fold), and the inverter modules are equidistant from the center point (e.g., the shaft 104). Although not shown, it should also be noted that a perpendicular bisector of each of the modules 52 would intersect the perpendicular bisectors of the other modules 52 at the center point.

Referring again to FIG. 1, in the depicted embodiment, the inverter 24 receives and shares coolant with the electric motor 30. The radiator 26 may be similarly connected to the inverter 24 and/or the electric motor 30. The electronic control system 18 is in operable communication with the actuator assembly 20, the battery 22, and the inverter assembly 24. Although not shown in detail, the electronic control system 18 includes various sensors and automotive control modules, or electronic control units (ECUs), such as an inverter control module and a vehicle controller, and at least one processor and/or a memory which includes instructions stored thereon (or in another computer-readable medium) for carrying out the processes and methods as described below. It should also be understood that the electronic control system 18 may include, or be integral with, portions of the inverter assembly 24 shown in FIG. 2, such as the controller 36 and the modulator 38.

During operation, referring to FIGS. 1 and 2, the automobile 10 is operated by providing power to the wheels 16 with the combustion engine 28 and the electric motor 30 in an alternating manner and/or with the combustion engine 28 and the electric motor 30 simultaneously. In order to power the electric motor 30, DC power is provided from the battery 22 (and, in the case of a fuel cell automobile, a fuel cell) to the inverter 24, which converts the DC power into AC power, before the power is sent to the electric motor 30. As will be appreciated by one skilled in the art, the conversion of DC power to AC power is substantially performed by operating (i.e., repeatedly switching) the transistors 33 within the inverter 24 at a "switching frequency" ($F_{sw}$), such as, for example, 12 kilohertz (kHz). Generally, the controller 36 produces a Pulse Width Modulation (PWM) signal for controlling the switching action of the inverter 24. In a preferred embodiment, the controller 36 preferably produces a discontinuous PWM (DPWM) signal having a single zero vector associated with each switching cycle of the inverter 24. The inverter 24 then converts the PWM signal to a modulated voltage waveform for operating the motor 30.

Referring now to FIGS. 3 and 4, the DC current that is provided to the inverter assembly 24 flows into each of the inverter modules 52 at the DC terminals 80. The current then flows toward the center of the inverter module 52 where it is delivered to the various electronic devices 56. Thus, DC current is provided to the electronic devices 56, or more specifically, the device portions 92 of bus bars 72 and 76, from opposing directions. Current also flows from the DC terminals 80 connected to bus bar 72 to the device portions of bus bar 72 in a similar manner.

After passing through the various electronic devices 56 and being converted into AC current, the current flows into bus bar 70 and from the inverter module 52 through the AC terminal 82, and eventually into the motor 30 (FIG. 1).

One advantage is that a symmetrical, scalable, three phase substrate layout is provided that produces substantially equal or equal parasitic effects on all three phases and reduces capacitive coupling. As a result, the arrangement of the inverter modules improves reliability, lowers inductance, and increases scalability.

Figure 7:
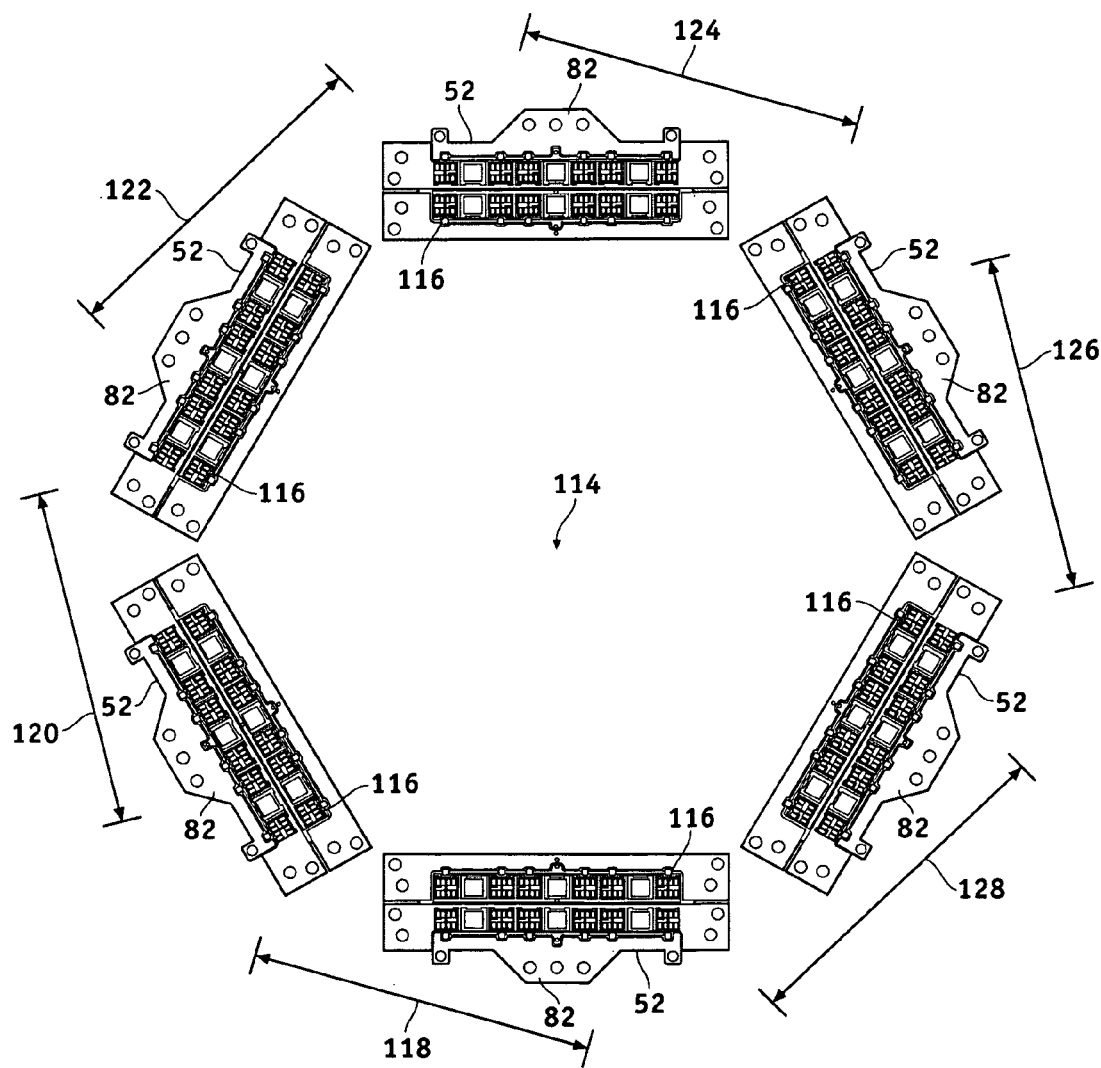
FIGS. 7 and 8 are plan views of inverter module arrangements according to various embodiments of the present invention.

FIG. 7 illustrates an arrangement of inverter modules 52, according to another embodiment of the present invention. The arrangement includes six inverter modules 52 (similar to those described above) that, although not shown, may be mounted to a housing similar to that described above. The inverter modules 52 are symmetrically arranged about a central point 114 in a shape similar to a hexagon. Stated differently, if the inverter modules 52 are considered to include pairs of adjacent inverter modules (e.g., six pairs), corresponding points (e.g., a selected die 116) on the adjacent inverter modules within each pair (or all of the pairs) are separated by the same distance. In FIG. 7, distances 118-128 are measured between the selected die 116 on the adjacent inverter modules 52. As is apparent in FIG. 7, all six distances 118-128 are substantially the same. The symmetry shown in FIG. 6 also includes a rotational symmetry (e.g., six-fold), and the inverter modules are equidistant from the center point 114. Although not shown, it should also be noted that a perpendicular bisector of each of the modules 52 would intersect the perpendicular bisectors of the other modules 52 at the center point 114.

Figure 8:
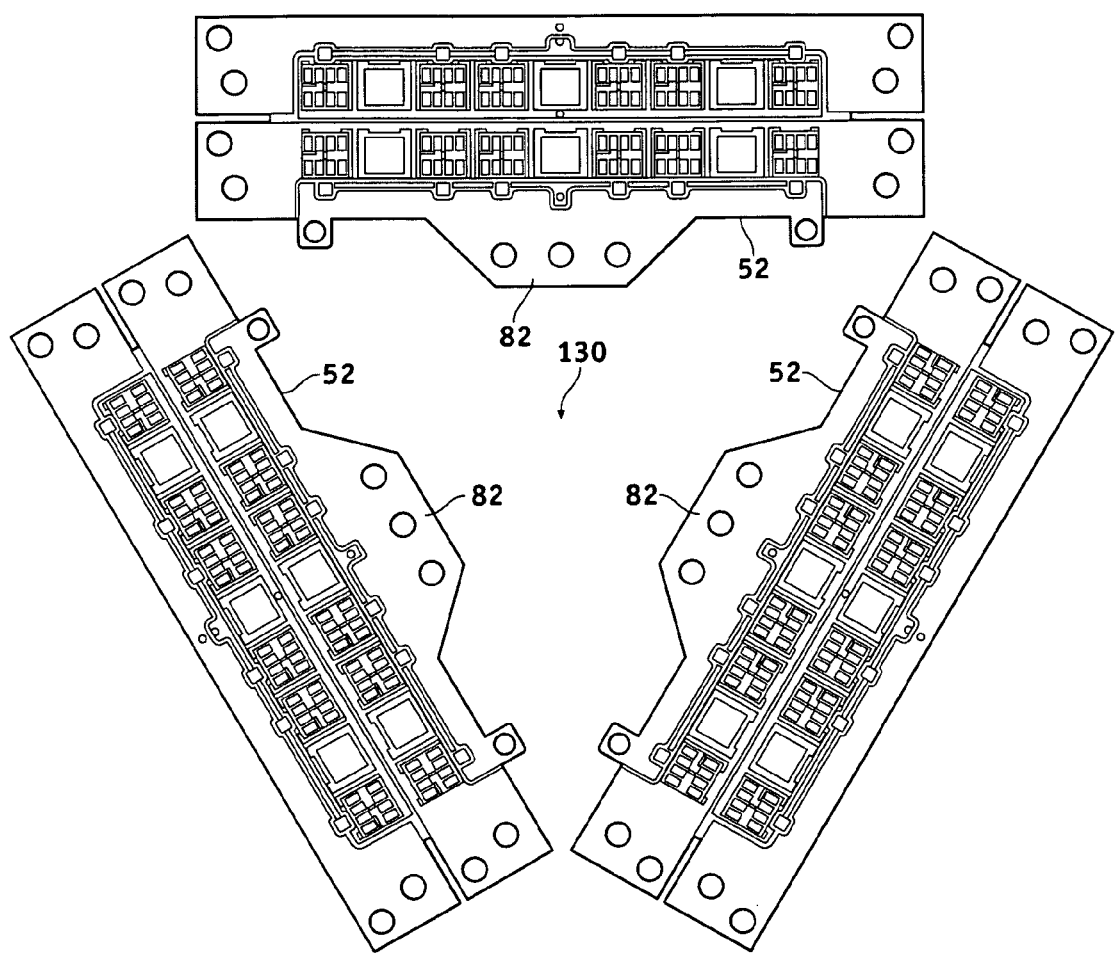

FIG. 8 illustrates an arrangement of inverter modules 52, according to a further embodiment. The arrangement shown in FIG. 8 is similar to that shown in FIG. 6 and includes three inverter modules 52 symmetrically arranged about a center point 130. However, in the embodiment shown in FIG. 8, the inverter modules are arranged such that the AC terminals 82 face inwards towards the center point 130. Although not shown, the modules 52 may be mounted on a housing similar to that described above.

Other embodiments may utilize inverter (or power) modules different than those described above and shown in the drawings. The numbers of inverter modules may be varied (e.g., eight may be used) and arranged in shapes similar to various other polygons, such as an octagon. Each of the inverter modules may correspond to an individual phase of the operation of the motor, or several of the inverter modules may be connected in parallel to jointly correspond to a single phase of the operation of the motor.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A power converter assembly comprising:
a first power module;
a second power module coupled to the first power module such that the second power module is separated from the first power module by a first distance;
a third power module coupled to the first and second power modules such that the third power module is separated from the second power module by a second distance and is separated from the first power module by a third distance, the first, second, and third distances being substantially the same; and
fourth, fifth, and sixth power modules coupled to the first, second, and third power modules, wherein the first, second, third, fourth, fifth, and sixth power modules form six pairs of adjacent inverter modules, and wherein the six pairs of adjacent inverter modules have rotational symmetry and are equidistant from a center point.

2. The power converter assembly of claim 1, wherein each of the first, second, and third power modules comprises at least one electronic device.

3. The power converter assembly of claim 2, wherein each of the power modules comprises a substrate having the respective at least one electronic device coupled thereto.

4. The power converter assembly of claim 3, wherein the at least one electronic device of the each of the power modules comprises a transistor and a diode.

5. The power converter assembly of claim 1, further comprising a base, the first, second, and third power modules being coupled to the base.

6. The power converter assembly of claim 5, further comprising a plurality of conductive members coupled to the base and electrically interconnecting the first, second, and third power modules.

7. An automotive inverter assembly comprising:
a base; and
a plurality of substantially identical inverter modules coupled to the base, the plurality of substantially identical inverter modules comprising a plurality of pairs of adjacent inverter modules, each of the pairs comprising first and second inverter modules, a selected point on the first inverter module being separated from a corresponding point on the second inverter module by a distance within each pair, the plurality of substantially identical inverter modules being arranged such that the distance is substantially the same for each pair of adjacent inverter modules, wherein the plurality of pairs of adjacent inverter modules includes at least six pairs of adjacent inverter modules, and wherein the at least six pairs of adjacent inverter modules have rotational symmetry and are equidistant from a center point.

8. The automotive inverter assembly of claim 7, wherein each of the plurality of inverter modules comprises a substrate and at least one electronic device coupled to the substrate.

9. The automotive inverter assembly of claim 8, wherein the at least one electronic device comprises a transistor and a diode.

10. The automotive inverter assembly of claim 9, further comprising a plurality of conductive members electrically interconnecting the plurality of inverter modules.

11. The automotive inverter assembly of claim 10, wherein the plurality of inverter modules comprises six inverter modules.

12. The automotive inverter assembly of claim 10, wherein the plurality of inverter modules comprises more than three inverter modules.

13. An automotive drive system comprising:
   an electric motor;
   a direct current (DC) power supply coupled to the electric motor;
   a power inverter coupled to the electric motor and the DC power supply to receive DC power from the DC power supply and provide alternating current (AC) power to the electric motor, the power inverter comprising:
      a base;
      a plurality of substantially identical inverter modules coupled to the base, the plurality of substantially identical inverter modules comprising a plurality of pairs of adjacent inverter modules, each of the pairs comprising first and second inverter modules, a selected point on the first inverter module being separated from a corresponding point on the second inverter module by a distance within each pair, the plurality of substantially identical inverter modules being arranged such that the distance is substantially the same for each pair of adjacent inverter modules, wherein the plurality of pairs of adjacent inverter modules includes at least six pairs of adjacent inverter modules, and wherein the at least six pairs of adjacent inverter modules have rotational symmetry and are equidistant from a center point; and
   a processor in operable communication with and configured to control the electric motor, the DC power supply, and the power inverter.

14. The automotive drive system of claim 13, wherein each of the inverter modules comprises a substrate and a transistor coupled to the substrate.

15. The automotive drive system of claim 14, wherein the power inverter further comprises a plurality of conductive members electrically interconnecting the inverter modules.

16. The automotive drive system of claim 15, wherein the base has an opening therethrough at the center point of the base and the electric motor comprises a motor shaft that extends through the opening of the base.

* * * * *